(12) United States Patent
Ishii

(10) Patent No.: US 7,863,910 B2
(45) Date of Patent: Jan. 4, 2011

(54) INSULATION RESISTANCE DETECTING APPARATUS

(75) Inventor: Mitsunori Ishii, Kanagawa (JP)

(73) Assignees: NEC Corporation, Tokyo (JP); Fuji Jukogyo Kabushiki Kaisha, Tokyo (JP)

( * ) Notice: Subject to any disclaimer, the term of this patent is extended or adjusted under 35 U.S.C. 154(b) by 357 days.

(21) Appl. No.: 12/065,326

(22) PCT Filed: Aug. 9, 2006

(86) PCT No.: PCT/JP2006/315715

§ 371 (c)(1),
(2), (4) Date: Feb. 29, 2008

(87) PCT Pub. No.: WO2007/026514

PCT Pub. Date: Mar. 8, 2007

(65) Prior Publication Data

US 2009/0153156 A1    Jun. 18, 2009

(30) Foreign Application Priority Data

Aug. 29, 2005   (JP)   ............................ 2005-247300

(51) Int. Cl.
  *H01H 31/12*   (2006.01)
  *G01R 27/08*   (2006.01)
(52) U.S. Cl. .................... 324/704; 324/551; 324/710
(58) Field of Classification Search ................ 324/509, 324/527, 704, 551, 710
  See application file for complete search history.

(56) References Cited

U.S. PATENT DOCUMENTS 6,639,410 B2 * 10/2003 Kamitani .................... 324/523
6,906,525 B2 * 6/2005 Suzuki ....................... 324/509
2005/0073320 A1 * 4/2005 Yamamoto et al. .......... 324/557

FOREIGN PATENT DOCUMENTS

| JP | 52-019581 A | 2/1977 |
| JP | 8-070503 A | 3/1996 |
| JP | 11-264853 A | 9/1999 |
| JP | 2002-209331 A | 7/2002 |
| JP | 2003-250201 A | 9/2003 |
| JP | 2005-114497 A | 4/2005 |

* cited by examiner

*Primary Examiner*—Timothy J Dole
*Assistant Examiner*—Farhana Hoque
(74) *Attorney, Agent, or Firm*—Dickstein, Shapiro, LLP.

(57) ABSTRACT

There is provided an insulation resistance detecting apparatus that accurately calculates an insulation resistance value in real time. The insulation resistance detecting apparatus includes: pulse generator 10, comparator 11 to which reference voltage $V_{REF}$ is supplied as one input and an output from pulse generator 10 is supplied as the other input, comparator 11 that outputs a low-level signal when the level of the other input exceeds reference voltage $V_{REF}$, and that outputs a high-level signal when the level of the other input is lower than reference voltage $V_{REF}$; resistance R1 provided on the output line of pulse generator 10 in series; coupling capacitor C2 one end of which is connected to the other input line of comparator 11 and the other end of which is connected to the output line of high-voltage DC power supply 21; capacitor C1 one end of which is connected to the other input line of comparator 11 and the other end of which is connected to a ground; and pulse width measuring device 12 that calculates the value of insulation resistance on the output line of high-voltage DC power supply 21 from the duty ratio of an output waveform of comparator 11.

7 Claims, 5 Drawing Sheets

US 7,863,910 B2

INSULATION RESISTANCE DETECTING APPARATUS

TECHNICAL FIELD

The present invention relates to an apparatus that detects the insulation resistance of a unit including a DC power supply, for example a high-voltage system provided in an electric vehicle such as electric and hybrid automobiles.

BACKGROUND ART

Electric vehicles such as electric and hybrid automobiles include a high-voltage system that generates high voltages, for example 60 V DC or higher. A high-voltage line in electric vehicles including such a high-voltage system is designed typically in such a manner that the high-voltage line is insulated from the chassis ground. If the insulation resistance between the high-voltage line and the chassis ground decreases below a predetermined value, damage such as an electric shock to the human body can be caused depending on the position where the vehicle contacts the human body. Therefore, the insulation resistance between the high-voltage line and the chassis ground needs to be detected and, if an insulation resistance drop is found, warning needs to be given to a user to prompt the user to have the vehicle appropriately serviced.

A ground fault detecting circuit that is an apparatus for detecting the insulation resistance between a high-voltage line and a chassis ground is disclosed in Japanese Patent Laid-Open No. 2005-114497. FIG. 1 shows a configuration of the ground fault detecting circuit.

Referring to FIG. 1, the ground fault detecting circuit is a circuit detecting a ground fault from high-voltage DC power supply 100 to a body of a vehicle in an electric automobile driving circuit that includes high-voltage DC power supply 100 including batteries, DC/AC converter 101 including an inverter for converting an output from high-voltage DC power supply 100 to an AC current, and AC motor 102 supplied with an output from DC/AC converter 101. The ground fault detecting circuit includes oscillation circuit 103 outputting an AC signal (rectangular pulse) and voltage level detector 104 supplied with an output from oscillation circuit 103 through detection resistance 107, wherein a connection point P of oscillation circuit 103 and voltage detector 104 is connected onto a positive bus line of high-voltage DC power supply 100 by means of coupling capacitor 105 so that a DC component is blocked.

In the ground fault detecting circuit described above, a voltage appears at connection point P that results from division of a rectangular pulse from oscillation circuit 103 by insulation resistance 106 and detection resistance 107. In normal operation, the value of insulation resistance 106 can be assumed to be infinite and therefore the voltage at connection point P is substantially equal to the level of an output from oscillation circuit 103. If an insulation failure occurs and insulation resistance 106 drops, the voltage at connection point P significantly decreases. Therefore, an insulation failure can be found by detecting a change in the voltage at connection point P. Voltage level detector 104 determines that a ground fault has occurred between the negative bus line of high-voltage DC power supply 100 and the body of the vehicle if the voltage value at connection point P decreases below a reference voltage.

DISCLOSURE OF THE INVENTION

The detection circuit of the related art described above is capable of detecting occurrence of an insulation failure but cannot predict occurrence of an insulation failure. Therefore, when a user is notified of occurrence of an insulation failure, it is necessary for the user to immediately have the vehicle serviced because the insulation failure has already occurred at the time of the notification.

For the standpoint of the user, it is desirable to have some advance notice before the vehicle needs to be service. In order to allow time for maintenance, it is necessary to predict the occurrence of an insulation failure. To predict occurrence of an insulation failure, the value of the insulation resistance needs to be detected accurately and in real time. However, the detection circuit of the related art that detects the voltage (voltage divided by the insulation resistance and detection resistance) at connection point P is incapable of detecting such insulation resistance value.

An object of the present invention is to provide an insulation resistance detecting apparatus capable of solving the problem described above and detecting an insulation resistance value accurately in real time by using a simple configuration.

To achieve the object described above, an insulation resistance detecting apparatus according to the present invention is an insulation resistance detecting apparatus detecting insulation resistance between a DC power supply and a ground of an external unit including the DC power supply, including: a pulse generator that generates a rectangular pulse that has a constant period and a constant duty ratio; a comparator to which a reference voltage is supplied as one input and an output from the pulse generator is supplied as the other input, the comparator outputting a signal of a first level when a level of the other input exceeds the reference voltage, and outputting a signal of a second level different from the first level when a level of the other input is lower than the reference voltage; a first resistance provided in series on an output line of the pulse generator; a coupling capacitor one end of which is connected to a line by which the first resistance is connected to the other input of the comparator and the other end of which is connected to an output line of the DC power supply; a capacitor on one end of which is connected to a portion on the line, the portion being located between the first resistance and the coupling capacitor, the line being connected to the other input of the comparator, and the other end of which is connected to the ground; and a pulse width measuring device that measures a pulse width of an output waveform of the comparator to calculate a duty ratio of the output waveform and that calculates a value of the insulation resistance on the basis of the calculated duty ratio.

According to the configuration described above, rounding of a signal waveform (input waveform) provided to the other input of the comparator occurs because of the presence of the circuit including the first resistance, capacitor, coupling capacitor, and insulation resistance. In normal operation, the electric potential at the other input of the comparator gradually increases in the period in which the level of the pulse waveform signal from the pulse generator is high and, at a certain point in time, exceeds the reference voltage, then converges to the level equal to the high electric potential level of the pulse waveform signal. In the period in which the level of the pulse waveform signal from the pulse generator is low, the electric potential at the other input of the comparator decreases below the reference voltage. The transient response time of the comparator significantly varies depending on the magnitude of insulation resistance. Accordingly, the time T required for the electric potential at the other input of the comparator to exceed the reference voltage changes according to changes in the insulation resistance. Therefore, the duty ratio of the output waveform of the comparator changes correspondingly to changes in the insulation resistance and the value of the insulation resistance can be calculated from the duty ratio. Thus, according to the present invention, the value of insulation resistance can be accurately calculated in real time from the duty ratio of an output waveform of the comparator.

It should be noted that if no capacitor is provided between the first resistance and the coupling capacitor, the electric potential at the other input of the comparator increases steeply and changes in the time T will be small with respect to changes in insulation resistance, therefore the value of insulation resistance cannot accurately be detected.

As has been described above, according to the present invention, the insulation resistance of an external unit can be measured accurately in real time and therefore occurrence of an insulation failure can be predicted on the basis of the result of the measurement.

DESCRIPTION OF NUMERALS

10 Pulse generator
11 Comparator
12 Pulse width measuring device
20 High-voltage system
21 High-voltage DC power supply
22 Inverter
23 Motor

BEST MODE FOR CARRYING OUT THE INVENTION

An exemplary embodiment of the present invention will be described below with reference to drawings.

Figure 1:
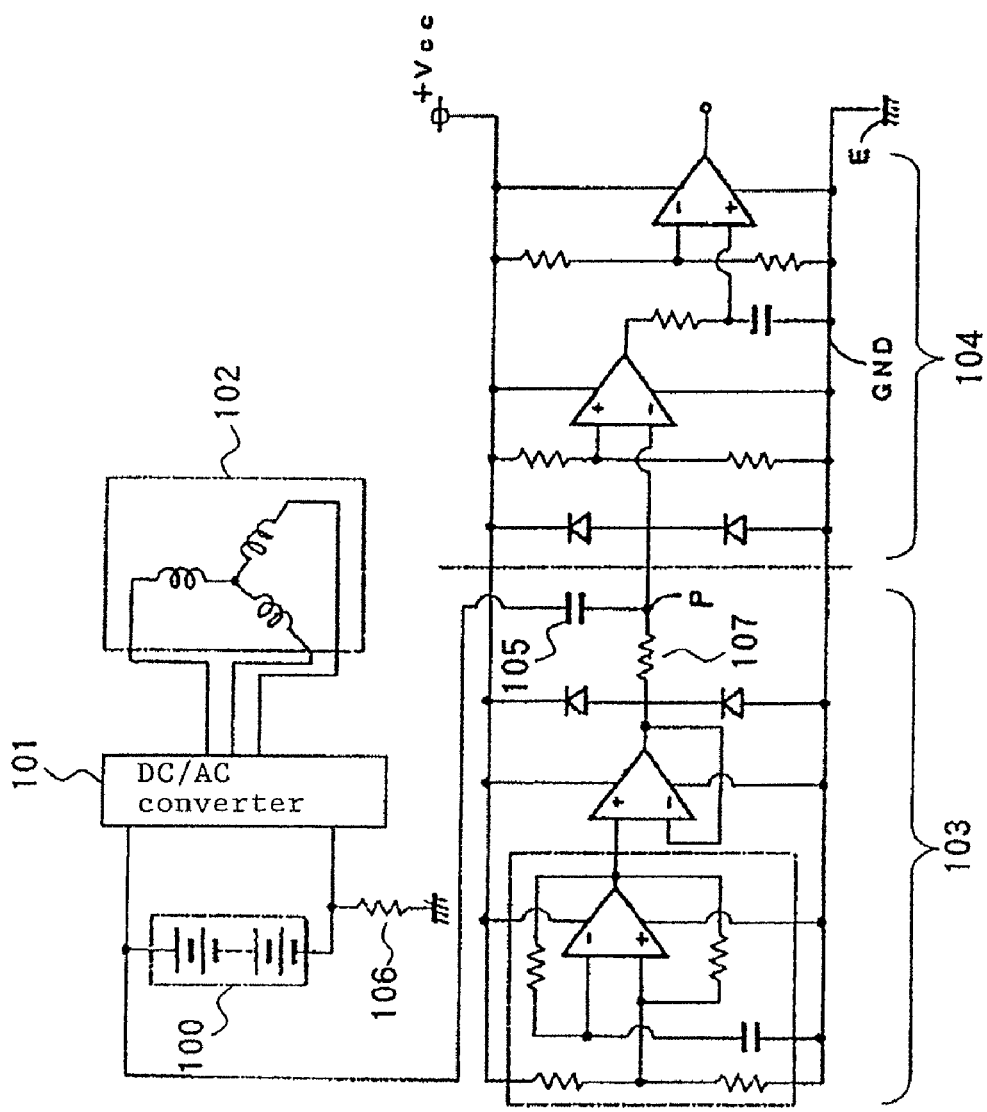
FIG. 1 is a block diagram showing a configuration of a ground fault detecting circuit of the related art.
Figure 2:
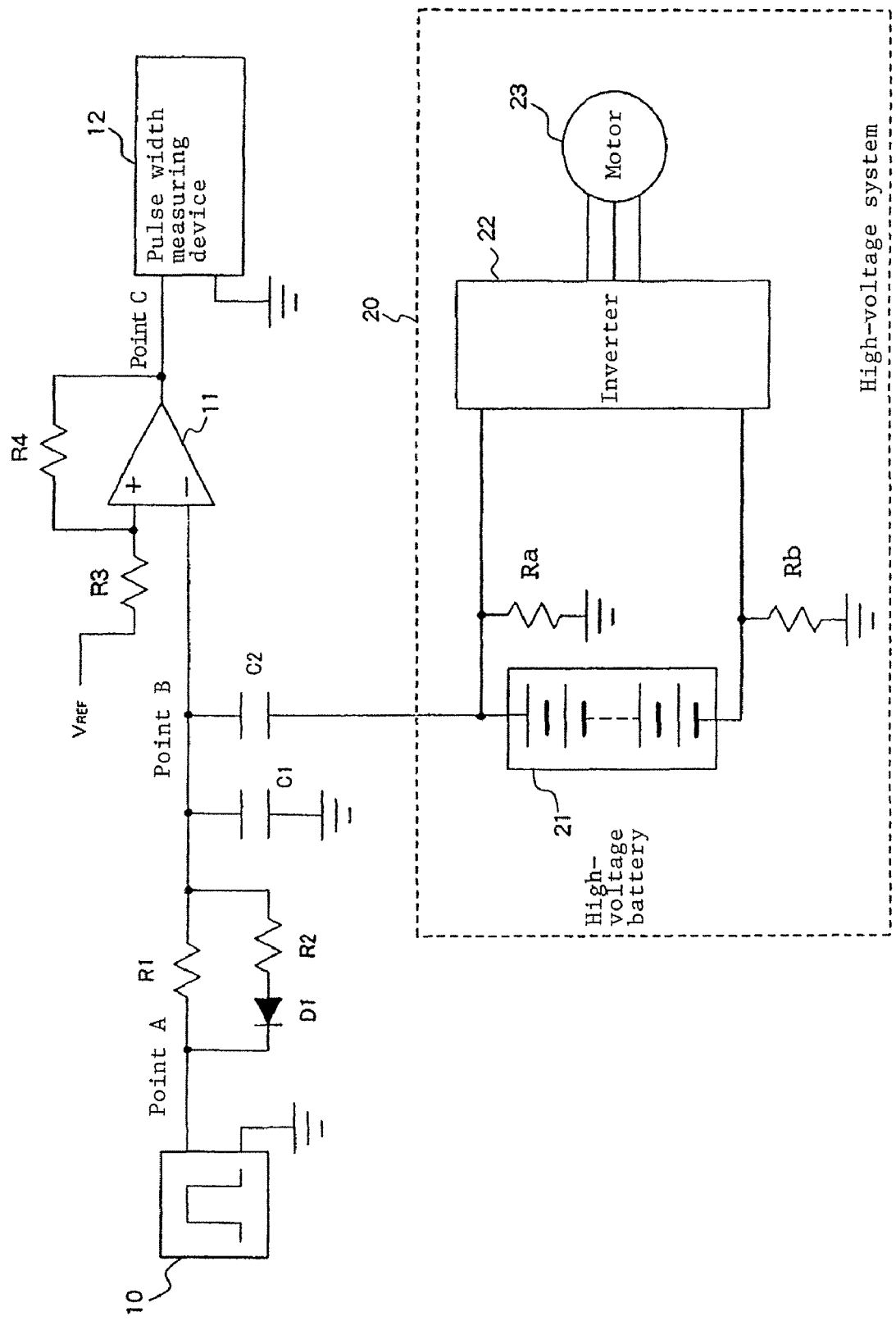
FIG. 2 is a block diagram showing a configuration of an insulation resistance detecting apparatus which is one exemplary embodiment of the present invention.

FIG. 2 is a block diagram showing a configuration of an insulation resistance detecting apparatus which is one exemplary embodiment of the present invention. Referring to FIG. 2, the insulation resistance detecting apparatus detects insulation resistance of high-voltage system 20 embedded in an electric vehicle such as an electric or hybrid automobile and includes pulse generator 10, comparator 11, pulse width measuring device 12, resistances R1, R2, diode D1, and capacitors C1, C2.

High-voltage system 20 includes high-voltage DC power supply 21 including batteries, inverter 22 for converting an output from high-voltage DC power supply 21 to an AC current, and motor 23 supplied with an output from inverter 22. Insulation resistance on a positive output line of high-voltage DC power supply 21 is denoted by Ra and insulation resistance on a negative output line of high-voltage DC power supply 21 is denoted by Rb.

Pulse generator 10 generates a rectangular pulse with a constant period and a constant duty ratio. Pulse generator 10 may be a dedicated IC or microcomputer. Resistance R1 is provided in series on the output line of pulse generator 10. A circuit, in which diode D1 and resistance R2 are connected in series, is provided in parallel with resistance R1. The connection point between the output of diode D1 and one end of resistance R1 to which pulse generator 10 is connected is denoted by Point A.

The other end of resistance R1 opposite to pulse generator 10 is connected to an input (negative input) of comparator 11. A line connecting resistance R1 to the input of comparator 11 is connected to a chassis ground through capacitor C1. Connected to the line between the connection point to capacitor C1 and the input of comparator 11 is an output line (positive output line in this example) of high-voltage DC power supply 21 belonging to high-voltage system 20 through coupling capacitor C2. The connection point between the input line of comparator 11 and coupling capacitor C2 is denoted by Point B.

Reference voltage $V_{REF}$ is supplied to the other input (positive input) of comparator 11 through resistance R3. Comparator 11 compares the electric potential level (input level) at Point B with reference voltage $V_{REF}$. Comparator 11 outputs a low-level output signal when the input level exceeds reference voltage $V_{REF}$; comparator 11 outputs a high-level output signal when the input level is lower than or equal to reference voltage $V_{REF}$. The output from comparator 11 is provided to pulse width measuring device 12.

Comparator 11 is a hysteresis circuit a part of whose output is positively fed back to its input through resistance R4 and has a so-called hysteresis characteristic (A characteristic in which a point, at which an output electric potential changes when an input voltage changes from low potential to high potential, is different from a point, at which an output electric potential changes when an input voltage changes from high potential to low potential.). By exploiting the hysteresis characteristic, chattering on the output line, which will be described later, is prevented. The point on the output line of comparator 11 at which resistance R4 is connected is denoted by Point C.

Pulse width measuring device 12, which may be a microcomputer that includes an input capture counter function capable of measuring pulse width, measures the pulse width of an output signal waveform of comparator 11 to obtain the duty ratio of the output signal waveform and calculates the insulation resistance (combined resistance of insulation resistances Ra and Rb) of high-voltage system 20 from the obtained duty ratio.

Figure 3:
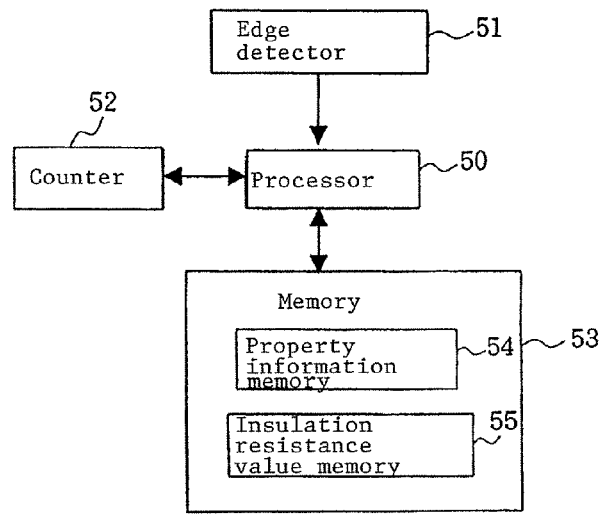
FIG. 3 is a block diagram showing the main part of a pulse width measuring device shown in FIG. 2.

FIG. 3 shows a main part of pulse width measuring device 12. Referring to FIG. 3, pulse width measuring device 12 includes processor 50, edge detector 51, counter 52, and memory 53. Memory 53 includes property information memory 54 in which the correspondence relationship between the duty ratio and the insulation resistance of high-voltage system 20 is stored and insulation resistance value memory 55 in which calculated insulation resistance values is stored. Edge detector 51 detects edges (rising and falling edges) of the output signal waveform of comparator 11.

Processor 50 controls activation of counter 52, obtains a count value of counter 52 on the basis of an edge detection signal from edge detector 51, obtains the pulse width of the output signal waveform of comparator 11 from the obtained count value, and calculates the duty ratio from the obtained pulse width. Processor 50 refers to the correspondence relationship between the duty ratio and the insulation resistance stored in property information memory 54 to calculate the insulation resistance of high-voltage system 20 based on the calculated duty ratio. The calculated insulation resistance is stored in insulation resistance value memory 55. Pulse width measuring device 12 repeats the sequence of pulse width measurement, duty ratio calculation, and insulation resistance calculation at regular time intervals and stores time-series data on insulation resistance values in insulation resistance value memory 55. Based on the time-series insulation resistance data stored in insulation resistance value memory 55, processor 50 estimates whether an insulation failure can occur. Processor 50 may assume that an insulation failure can occur if the magnitude of a change in an insulation resistance value obtained from the time-series data exceeds a predetermined value.

An operation of the insulation resistance detecting apparatus according to the exemplary embodiment will be described below.

A principle of detecting the value of insulation resistance that is the combined resistance of insulation resistance Ra and insulation resistance Rb of high-voltage system 20 will be described first.

When the level of a signal output from pulse generator 10 (electric potential level at Point A) changes from low to high, the charging of capacitor C1 through resistance R1 starts. The current also flows into coupling capacitor C2 because of the presence of insulation resistances Ra and Rb. The electric potential at Point B converges to the level equal to the high-level potential of the signal output from pulse generator 10 whereas the transient response time of comparator 11 significantly varies depending on the magnitude of the insulation resistance of high-voltage system 20.

Comparator 11 compares the electric potential level at Point B with reference voltage $V_{REF}$. When capacitor C1 and coupling capacitor C2 are charged and the electric potential level at Point B exceeds reference voltage $V_{REF}$, the level of the output signal of comparator 11 (the electric potential at Point C) changes from high to low. Chattering of the output signal at this time point is prevented by the hysteresis circuit described above.

When the level of the signal output from pulse generator 10 (the electric potential at Point A) changes from high to low, charges stored in capacitor C1 and coupling capacitor C2 are discharged through resistance R1, diode D1, and resistance R2. Here, the value of resistance R2 is chosen to be sufficiently smaller than the value of resistance R1 so that discharge is completed in a sufficiently short time. Once the charges stored in capacitor C1 and coupling capacitor C2 have been discharged, the electric potential at Point B becomes low. As a result, the level of the signal output from comparator 11 (the electric potential level at Point C) changes from low to high.

Figure 4:
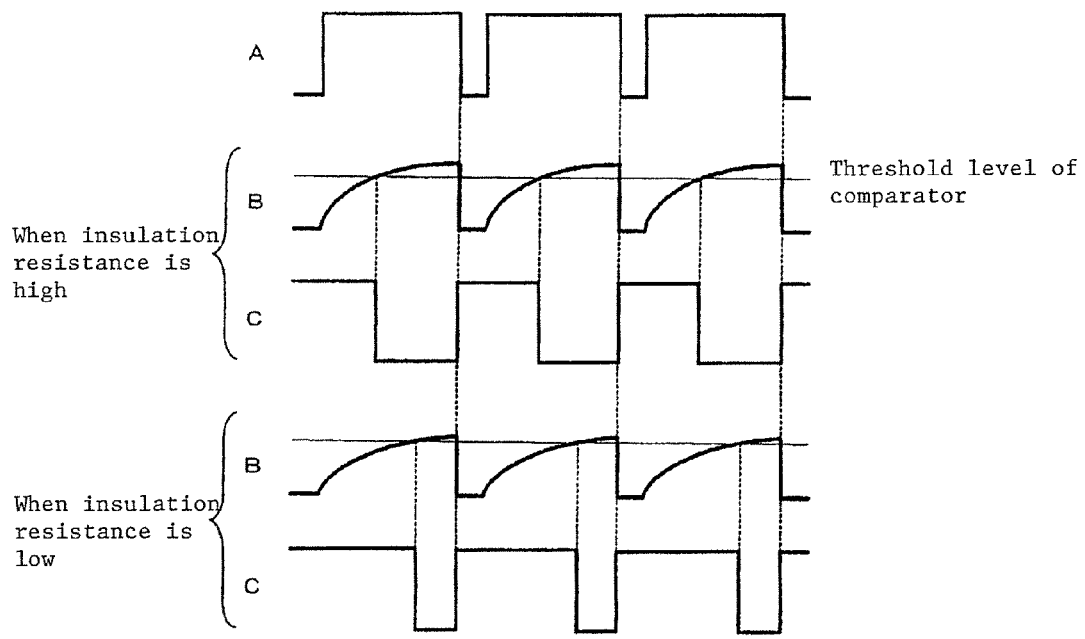
FIG. 4 is a diagram illustrating an operation principle of the insulation resistance detecting apparatus shown in FIG. 2.

FIG. 4 shows changes in electric potentials (waveforms) at Points A, B, and C in the operation described above. In FIG. 4, waveform A represents changes in the electric potential level at Point A, waveform B represents changes in the electric potential level at Point B, and waveform C represents changes in the electric potential level at Point C. The threshold (threshold level) of comparator 11 is reference voltage $V_{REF}$ plus hysteresis voltage.

Referring to FIG. 4, in the case where the insulation resistance of high-voltage system 20 is high, when the electric potential level at Point A changes from low to high, the electric potential level at Point B gradually increases and, at a certain point, exceeds the threshold of comparator 11, then converges to the level equal to the electric potential level at Point A (high level). When the electric potential level at point B exceeds the threshold of comparator 11, the electric potential level at Point C changes from high to low. When the electric potential level at Point A changes from low to high, the electric potential level at Point B immediately goes high. When the electric potential level at Point B goes high, the electric potential level at Point C changes from high to low.

In the case where the insulation resistance of high-voltage system 20 is low, when the electric potential level at Point A changes from low to high, the electric potential level at Point B gradually increases but the change is smaller than the case where the insulation resistance of high-voltage system 20 is high. Accordingly, it takes longer time for the electric potential at Point B to exceed the threshold of comparator 11 than in the case where the insulation resistance of high-voltage system 20 is high. Consequently, the duty ratio of waveform C in the case where the insulation resistance of high-voltage system 20 is low is higher than in the case where the insulation resistance of high-voltage system 20 is high.

As can be seen from the operation described above, the duty ratio of the output waveform of comparator 11 (waveform C) is small when the insulation resistance of high-voltage system 20 is high; the duty ratio of the output waveform of comparator 11 (waveform C) is high when the insulation resistance of high-voltage system 20 is low. Therefore, by detecting a change in the duty ratio of the output waveform of comparator 11, the value of insulation resistance of high-voltage system 20 can be known.

Figure 5:
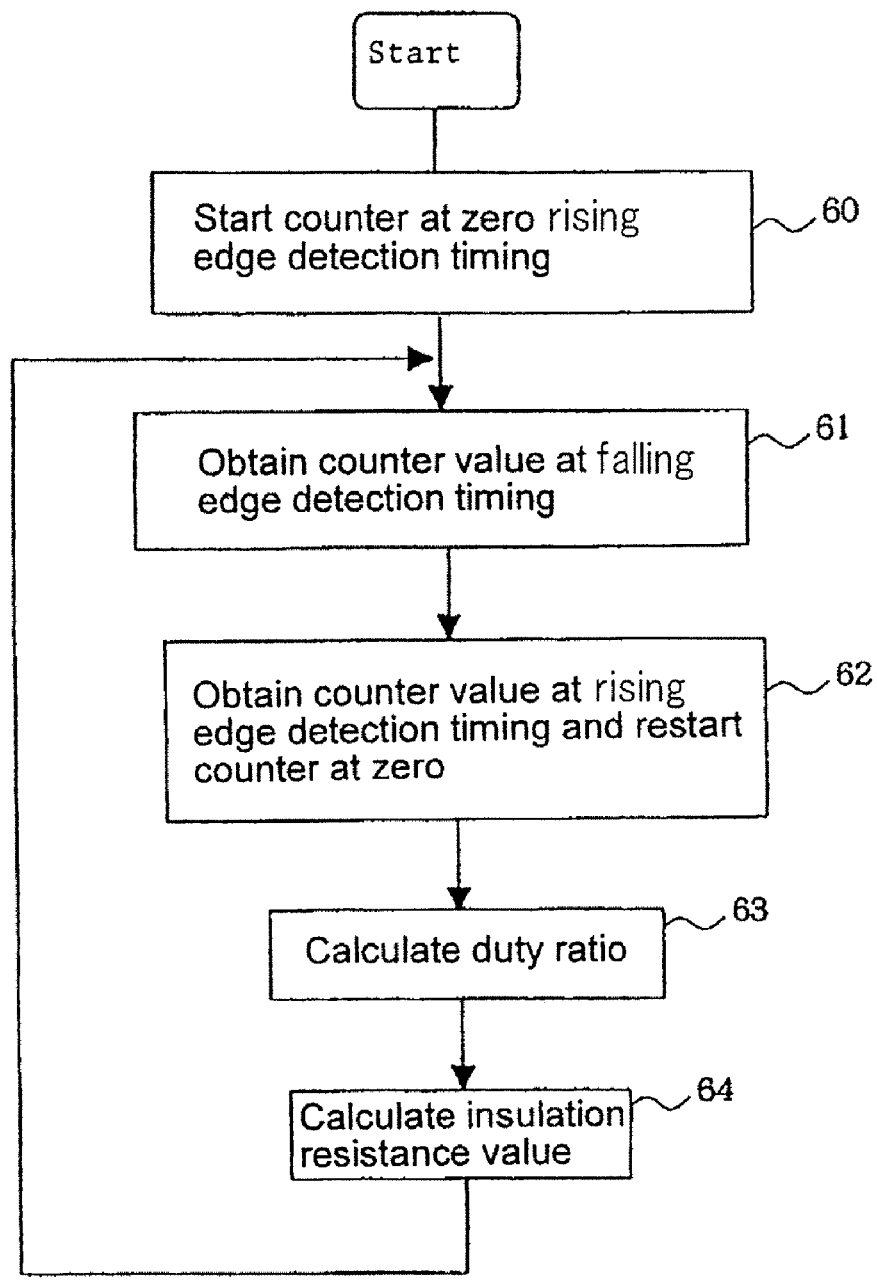
FIG. 5 is a flowchart illustrating a procedure for calculating insulation resistance by the pulse width measuring device shown in FIG. 2.

An operation for measuring in real time the insulation resistance (combined resistance of insulation resistances Ra and Rb) of high-voltage system 20 will be described below. FIG. 5 shows an exemplary procedure for calculating the insulation resistance by pulse width measuring device 12.

First, a rising edge of an output waveform of comparator 11 is detected and, at that timing, an interrupt is generated to cause counter 52 to start counting at zero (step 60). Then, the falling edge of the output waveform of comparator 11 is detected and, at that timing, an interrupt is generated to obtain the count value A of counter 52 (step 61). Then, a rising edge of the output waveform of comparator 11 is detected and, at that timing, an interrupt is generated to obtain the count value B of counter 52, then counter 52 is caused to restart counting at zero. Based on the count values A and B obtained at steps 61 and 62, the duty ratio D of the output waveform of comparator 11 is calculated by the following equation (step 63):

$$D=(A/B)*100(\%)$$

Then, the correspondence relationship between the duty ratio and the insulation resistance of high-voltage system 20 stored in property information memory 54 is referred to in order to calculate the value of the insulation resistance of high-voltage system 20 from duty ratio D calculated at step 62 (step 64).

The process from step 61 to step 64 is repeated to store time-series data on insulation resistance values in insulation resistance value memory 55. Processor 50 estimates a change in the insulation resistance value on the basis of the time-series data on the insulation resistance values stored in insulation resistance value memory 55 and determines whether an insulation failure can occur, on the basis of the estimation.

Figure 6:
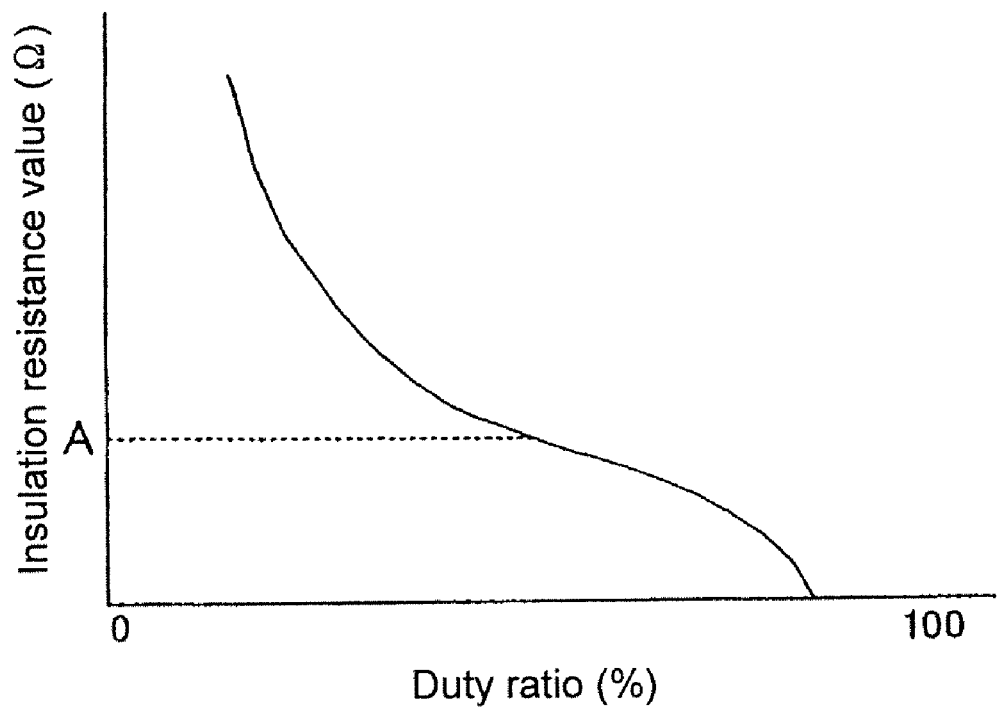
FIG. 6 is a diagram showing an example of a correspondence relationship between duty ratio and insulation resistance value.

The correspondence relationship between the duty ratio and the insulation resistance value depends on circuit constants. FIG. 6 shows an example of the correspondence relationship between the duty ratio and the insulation resistance value. In FIG. 6, the vertical axis represents insulation resistance value (Ω) and the horizontal axis represents duty ratio (%). The threshold of insulation resistance which is used to determine whether an insulation failure can occur is denoted by A. The circuit constants are set such that the ratio between the changes in the duty ratio and the changes in the insulation resistance values near threshold A becomes great. More specifically, the percentage of change in the duty ratio in the range of values of the insulation resistance that is to be detected within which occurrence of an insulation failure can be predicted is made greater than those in the other ranges. This allows the accuracy of insulation resistance value detection to be improved.

The configuration of the exemplary embodiment described above is one example of the present invention. Changes can be made to the configuration and operations as appropriate. For example, diode D1 and resistance R2 can be omitted from the configuration shown in FIG. 2. In that case, the electric potential level at Point B does not steeply fall and the duty ratio of the signal output waveform from pulse generator 10 needs to be set accordingly.

The positive feedback line of comparator 11 also may be omitted from the configuration shown in FIG. 2.

Apparatuses to which the present invention can be applied are not limited to a high-voltage system embedded in electric vehicles such as electric or hybrid automobiles. The present invention can be applied to any apparatuses that include a DC power supply and that require insulation of the output line of the DC power supply.

The invention claimed is:

1. An insulation resistance detecting apparatus which detects insulation resistance between a DC power supply and a ground of an external unit including said DC power supply, comprising:
   a pulse generator that generates a rectangular pulse that has a constant period and a constant duty ratio;
   a comparator to which a reference voltage is supplied as one input and an output from said pulse generator is supplied as the other input, said comparator outputting a signal of a first level when a level of said other input exceeds said reference voltage, and outputting a signal of a second level different from said first level when a level of said other input is lower than said reference voltage;
   a first resistance provided in series on an output line of said pulse generator;
   a coupling capacitor one end of which is connected to a line by which said first resistance is connected to said other input of said comparator and the other end of which is connected to an output line of said DC power supply;
   a capacitor one end of which is connected to a portion on said line, said portion being located between said first resistance and said coupling capacitor, said line being connected to said other input of said comparator, and the other end of which is connected to said ground; and
   a pulse width measuring device that measures a pulse width of an output waveform of said comparator to calculate a duty ratio of said output waveform and that calculates a value of said insulation resistance on the basis of said calculated duty ratio.

2. The insulation resistance detecting apparatus according to claim 1, wherein a circuit in which a diode and a second resistance are connected in series is provided on an output line of said pulse generator in parallel with said first resistance.

3. The insulation resistance detecting apparatus according to claim 2, wherein the value of said second resistance is smaller than the value of said first resistance.

4. The insulation resistance detecting apparatus according to claim 1, wherein said comparator is a hysteresis circuit in which a part of an output from said comparator is positively fed back to said another input of said comparator.

5. The insulation resistance detecting apparatus according to claim 1, wherein said pulse width measuring apparatus comprises:
   a counter;
   an edge detector that detects a rising edge and a falling edge of an output waveform of said comparator;
   a first memory in which data indicating a correspondence relationship between a duty ratio of an output waveform of said comparator and a value of said insulation resistance is stored beforehand; and
   a processor that controls said counter at a timing when said edge detector performs edge detection to obtain a pulse width of an output waveform of said comparator on the basis of the count value of said counter and that refers to data indicating a correspondence relationship stored in said first memory to obtain a value of said insulation resistance based on a duty ratio calculated from said obtained pulse width.

6. The insulation resistance detecting apparatus according to claim 5, comprising a second memory in which insulation resistance values calculated by said processor are stored in time series;
   wherein said processor determines that an insulation failure occurs when a change in the insulation resistance values in time-series insulation resistance value data stored in said second memory exceeds a predetermined value.

7. The insulation resistance detecting apparatus according to claim 5, wherein the percentage of change in a duty ratio in a predetermined range of insulation resistance values in the correspondence data stored in said first memory is greater than the percentage of change in a duty ratio outside said predetermined range of insulation resistance values.

* * * * *